United States Patent

Kurtz

[15] 3,697,762

[45] Oct. 10, 1972

[54] PHOTO ELECTRIC SWITCHING DEVICE

[72] Inventor: Stewart Kendall Kurtz, Yorktown Heights, N.Y.

[73] Assignee: North American Philips Corporation

[22] Filed: Dec. 14, 1970

[21] Appl. No.: 97,549

[52] U.S. Cl. ....................250/239, 250/239, 307/311

[51] Int. Cl. ............................H01j 5/02, H01j 39/12

[58] Field of Search.......307/311; 250/211 J, 217 SS, 250/234, 239, 216

[56] References Cited

UNITED STATES PATENTS

| | | | |
|---|---|---|---|
| 3,370,174 | 2/1968 | Toussaint | 250/211 J |
| 2,816,283 | 12/1957 | Steele | 250/211 J |
| 2,861,165 | 11/1958 | Aigrain et al. | 250/211 J |
| 2,928,950 | 3/1960 | Myer | 250/211 J |
| 3,194,967 | 7/1965 | Mash | 250/239 |

FOREIGN PATENTS OR APPLICATIONS

| | | | |
|---|---|---|---|
| 1,370,725 | 7/1964 | France | 250/234 |

*Primary Examiner*—Donald D. Forrer
*Assistant Examiner*—B. P. Davis
*Attorney*—Frank R. Trifari

[57] ABSTRACT

A photo electric switching device having a light emitting diode and light-sensing element arranged in side-by-side relation. A light reflecting element is arranged so that when it is passed into the path of radiant energy eminating from the light emitting diode, a large portion of the light beam will be reflected to the light-sensing element so as to initiate an "on" or an "off" function. A lens element may be arranged in the path of the light beam so as to increase the degree of resolution and the elements can be arranged on a flat-pack with other electronic circuitry in a convenient switching unit.

8 Claims, 6 Drawing Figures

INVENTOR.
STEWART KENDALL KURTZ

BY [signature]
AGENT

INVENTOR.
STEWART WENDELL KURTZ
BY
AGENT

PHOTO ELECTRIC SWITCHING DEVICE

BACKGROUND OF THE INVENTION

This invention relates generally to the field of photo electronics and more specifically to a device utilizing light emitting and sensing elements particularly useful as a switching device.

Devices utilizing light emitting elements, such as a commercially available light emitting p-n junction diode (hereinafter referred to as an LED), and a light-sensing element, such as a light detecting p-n junction diode, for example a silicon phototransistor (PT), for detecting the presence or absence of an article in the light path between the two elements and acting as a switch in response to such event, is well-known in the art and many variations of such devices are presently in use. In such devices the LED is remote from the detecting phototransistor and the switching function will only operate when the light beam is broken by an article which is non-transparent. For detecting the presence of a reflective body, the LED and phototransistor are usually placed in side-by-side relation with the switching function being initiated when the light beam from the LED is reflected from the surface of the reflective body at an incident angle thereto and directed at the phototransistor. The advantage of using photo-sensitive elements for a switching device in lieu of mechanical means is the exceptionally long life available with the use of photo electronic elements. However, in order to be able to rely on such devices for use in high speed electronic circuitry to initiate a particular electronic function, a high degree of resolution is required so that accurate switching occurs with reliable frequency. The general object of the present invention is, therefore, to provide an improved switching device utilizing light emitting and sensing diodes.

Another object of the present invention is to provide a photo electric switching device in which the radiation emitting diode and phototransistor are in side-by-side or back-to-back relation and are provided with means for focusing the radiation to a remote focal point having an area smaller than the active area of the emitting junction of the radiation emitting diode, and which is therefore particularly well suited for reflecting the light incident on a reflecting body which has been moved to that focal point, onto the phototransistor so as to achieve the high resolution required for reliable operation.

A still further object of the present invention is to utilize light emitting and sensing diodes in a side-by-side relation so as to function as a switch for triggering further electronic circuitry when a reflective shutter element is manually inserted into the path of radiation eminating from the light emitting diode, thereby reflecting the radiant energy onto the detecting element.

Various other features, objects and advantages of the present invention will become more apparent from the following detailed description in connection with the accompanying drawings, and the novel features of the invention will be pointed out hereinafter in the appended claims.

DESCRIPTION OF THE INVENTION

Figure 1:
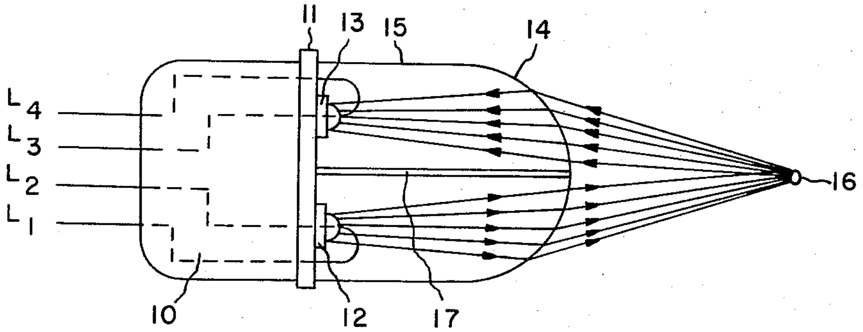
FIG. 1 is a side elevational view of the apparatus of the present invention with schematic representation of the emitted light path.
Figure 2:
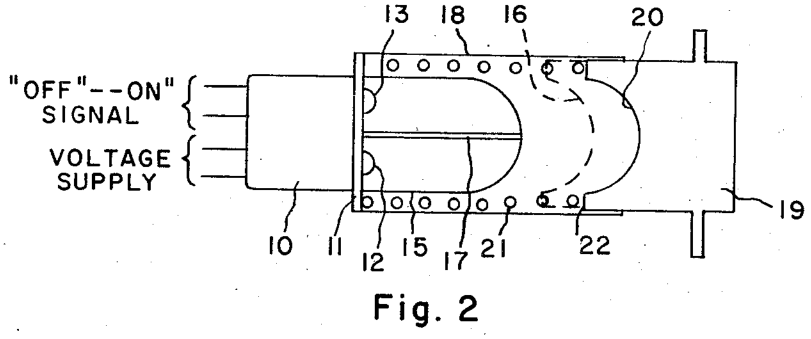
FIG. 2 is a view similar to FIG. 1 showing one embodiment of the present invention.

The principles of operation of the photo electric switching device according to the embodiment shown in FIG. 2, is schematically represented in FIG. 1. A base member 10, of insulating material, supports an insulating disc 11 which serves as the mounting plate for an LED device 12 and a phototransistor (PT) 13. The combination of LED device and phototransistor is commonly referred to as a matched pair of emitters and detectors, or LESD. The LED device used herein is the commercially available light emitting p-n junction diode, usually made of galium phosphorous, galium arsenide or galium arsenide phosphorous. The light detecting element is a commercially available silicon phototransistor. Examples of such devices are the Hewlitt-Packard models HP4120 and 4220 or the Spectronics model Nos. SE1450 and SD1440 devices. A detailed description as to the operation and function of the LED and PT elements will not be undertaken here as the principles of their operation are well-known in the art. Very briefly, when an appropriate voltage is impressed across the LED element, it will be excited to a point of emitting a narrow band of light, usually in the infra-red range. When light of the appropriate wavelength is impressed upon the phototransistor, it will become saturated and its output will be a bi-stable "on" or "off" signal. In order to obtain the desired reliability of operation, the beam of radiant energy impressed upon the phototransistor should be sufficiently narrow and of sufficient intensity to insure reliable operation. Simply spacing apart the LED and PT and directing the energy from the LED to the PT element does not always ensure the proper intensity. In order to guarantee the high degree of resolution therefore, a focusing lens 14 is arranged with a plastic envelope 15 incapsulating the photo electronic elements. The lens 14 is constructed of known plastic elements having additives to function as an optical filter for emitting light thereby reducing background interference. When the proper voltage is impressed on the LED 12, the beam of radiant energy eminating therefrom will be focused through the lens 14 to a focal point 16 having an active area smaller than the active area of the emitting junction. When a reflective surface is brought to that focal point, the greatest amount of radiant energy will be reflected from its surface at an appropriate incident angle toward the focusing lens 14. Again, the radiant energy rays will be focused into a narrow intense beam directed at the phototransistor 13. When no reflecting surface is brought to the focal point, obviously the light from the LED will simply pass therethrough. Although no reflective surface is shown in FIG. 1, the energy rays are shown as being reflected at the focal point as though such a surface were present. A spacing element 17, being optically opaque, is arranged between the LED 12 and phototransistor 13 so as to eliminate the possibility of premature or inadvertant triggering of the phototransistor.

The header or base element 10 is of the standard commercially available four lead type. Leads L1 and L2 are connected to a source of voltage so as to impress he the voltage on the LED device, and leads 3 and 4 provide the "on"-"off" signal to the electronic circuitry intended to receive such signal.

A manually actuated switching device utilizing the construction described above is shown in FIG. 2. As shown in FIG. 2, the combination of base element 10 with LESD combination mounted thereon incapsulated in envelope is and lens 14 is supported in a housing 18. The housing is provided at one end thereof with a manually operable pushbutton 19 which has a bottom reflective surface 20. The pushbutton is spring-loaded within the housing by compression spring 21 bearing at one end against the disc 11 and at its other end against a shoulder 22 of the pushbutton 19. The the pushbutton 19 is depressed to the position shown in dotted lines, the reflective surface 20 will reach the focal point 16 and with the appropriate voltage impressed across the LED 12, the phototransistor will receive the reflected light beam and will function to produce the "on" or the "off" signal. Release of the button will return it to its initial position.

Figure 3:
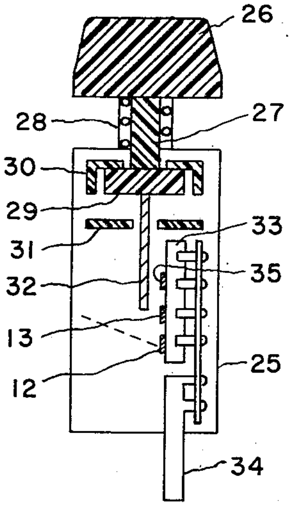
FIG. 3 is another side elevational view in partial section showing another embodiment of the present invention in the non-operative position.
Figure 4:
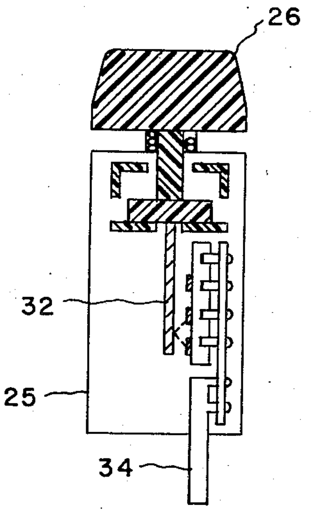
FIG. 4 is a view similar to FIG. 3 showing the embodiment of FIG. 3 in the operative position.

Another embodiment of the pushbutton photo electric switching device is shown in FIGS. 3 and 4. The switching device in this embodiment comprises a housing 25 supporting a pushbutton 26 on shaft 27 slidably supported through one end of the housing. The pushbutton 26 is spring-loaded by spring 28 around shaft 27 and the shaft is provided with a stop element 29. The stop element 29 is arranged for cooperative engagement with either the members 30 or 31 within the housing. A shutter element 32 having at least one side thereof made of optically reflective material extends into the housing from stop member 29. An electronic flatpack, or printed circuit board 33, is supported within the housing and has a plurality of terminals for connection with cable 34 leading to other electronic circuitry. The flatpack 33 is provided with the optoelectronic devices such as the LED 12 and PT 13, both being of the type described above with respect to the embodiment shown in FIGS. 1 and 2. Electronic element 35 is mounted on the flatpack and may be the familiar Schmitt triggering circuit incorporated in an integrated chip. The LED and PT are spaced approximately 0.085 inch apart, center to center, with the reflective surface of the shutter element 32 approximately 0.6 inch from the front of both elements.

In order to initiate an appropriate signal from the phototransistor the pushbutton 26 will be depressed interrupting the beam of radiant energy eminating from the LED (shown in dotted lines) so that the beam will strike the reflective surface of the shutter 32 at an angle incident thereto so that enough of the beam will be reflected onto the phototransistor so as to cause it to function. In FIG. 3 the pushbutton has not been depressed and the beam of radiant energy is shown as the dotted line striking the inner surface of the housing which may be of a non-reflective character. FIG. 4 shows the position of the pushbutton when it has been depressed and the travel of the beam of light.

Figure 5:
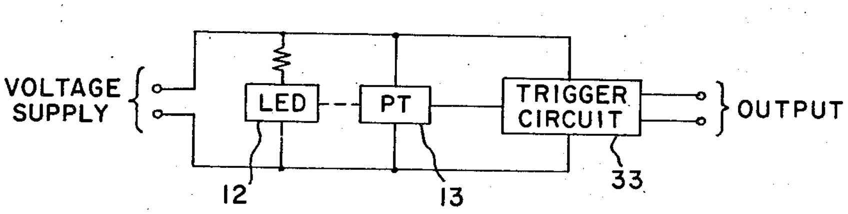
FIG. 5 is a block diagram showing the electrical connection of the various electronic elements of the embodiment shown in FIGS. 3 and 4.

FIG. 5 shows in block diagrammatic form the electrical arrangement of the various elements on the flatpack. When the pushbutton is depressed and the beam of infra-red energy (dotted line) is reflected onto the phototransistor, the radiation will cause the phototransistor to become saturated providing a positive voltage to trigger the Schmitt circuit. In such a circuit, a slowly changing input voltage will, upon reaching a critical point, cause the output to change states very rapidly. The arrangement of elements in the single unit shown in FIGS. 3 and 4, therefore, provides a very reliable and accurately operating keyboard switch.

Figure 6:
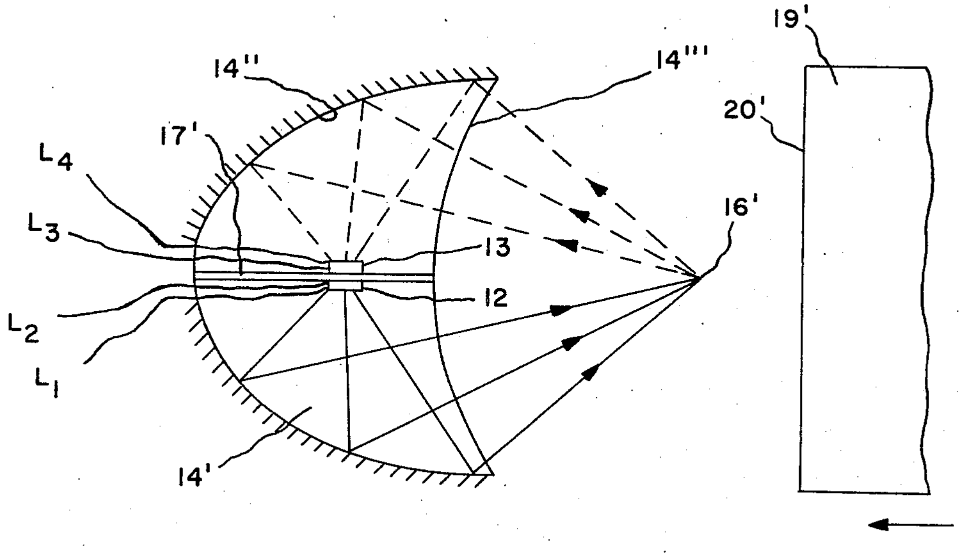
FIG. 6 is a sectional view of a further embodiment of the invention using focusing means.

A further embodiment using a focusing technique is illustrated in FIG. 6 which shows the LED 12 and phototransistor 13 embedded within the focusing medium 14' in a back-to-back arrangement. The elements 12 and 13 are mounted on the opaque spacing element 17' so as to eliminate stray radiation, and are located at a first focusing point so that when the LED 12 has the proper voltage impressed on it, radiant energy will be directed through the focusing medium 14' and reflected off its inner reflecting surface 14'' and directed to the focal point 16'. When the pushbutton 19' is depressed, and its reflecting surface 20' reaches the focal point, the light beam will be reflected back into the focusing medium and again reflected off its curved inner surface (dotted lines) at the appropriate incident angles so as to be focused at the PT for causing it to function.

Best results are obtained when the focusing medium 14' is formed with its curved surface 14'' being a double elipsoid and its light emitting surface 14''' being spherical.

The leads $L_1$, $L_2$ and $L_3$, $L_4$ may extend through the focusing medium for appropriate connection and the focusing medium and pushbutton may be housed in a plastic envelope similar to envelope 15 of FIG. 2, to thereby form the switching unit.

While the invention has been described and illustrated with respect to certain embodiments which give satisfactory results, it will be understood by those skilled in the art, after understanding the purpose of the invention, that various other changes and modifications may be made without departing from the spirit and scope of the invention, and it is therefore, intended in the appended claims to cover all such changes and modifications.

What is claimed is:

1. An electrical switching device comprising a support, a light emitting device mounted on said support, a light detecting device for performing a switching function mounted on the support in side-by-side relation with said light emitting device, means connected to said light emitting device for causing said device to emit radiant energy, means connected to said support for focusing said emitted radiant energy, manually operable reflecting means arranged for movement with respect to said emitting and detecting devices so that when said reflecting means is moved from an inoperative to an operative position substantially at the focal point of said focusing means the radiant energy being emitted from said light emitting device will be reflected by said reflecting means and directed at said detecting means to thereby initiate the switching function.

2. The switching device according to claim 1 wherein said light emitting device is a light emitting p-n junction diode, said light detecting device is a silicon phototransistor and said means for causing said diode to emit radiant energy is a source of electrical energy.

3. An electrical switching device comprising a support, a light emitting device being a light emitting p-n junction diode mounted on said support, a light detecting device being a silicon phototransistor for performing a switching function mounted on the support in side-by-side relation with said light emitting device, a source of electrical energy connected to said light emitting device for causing said device to emit radiant energy, manually operable reflecting means arranged for movement with respect to said emitting and detecting devices so that when said reflecting means is moved from an inoperative to an operative position the radiant energy being emitted from said light emitting device will be reflected by said reflecting means and directed at said detecting means to thereby initiate the switching function. a housing having a non-reflective inner surface for holding said support and reflecting means therein, a pushbutton slidably mounted at one end of said housing and connected to said reflecting means for manually moving said reflecting means into said operative position when said pushbutton is depressed, and spring means in cooperative engagement with said pushbutton for returning said reflecting means to the non-operative position when said pushbutton is released.

4. The switching device according to claim 3 wherein said light emitting diode and said phototransistor are mounted on a circuit board and wherein said reflecting means is a shutter element which is moved into the path of radiant energy eminating from said light emitting diode when said pushbutton is depressed, and further comprising a Schmitt trigger circuit mounted on said circuit board and electrically connected to said phototransistor and to said source of electrical energy so that when said phototransistor is caused to operate it will trigger said Schmitt circuit which changes states very rapidly.

5. The switching device according to claim 3 further comprising a focusing lens mounted within said housing for focusing the beam of radiant energy eminating from said light emitting diode to a focal point and for focusing the reflected beam of radiant energy at said phototransistor when said reflecting means is moved to said focal point.

6. The switching device according to claim 5 wherein said reflecting means is a reflecting surface of said pushbutton so that when said pushbutton is depressed to the operative position said reflecting surface will be moved to said focal point.

7. The switching device according to claim 6 further comprising an optically opaque spacing element mounted between said light emitting diode and said phototransistor for preventing unfocused light ray from striking and triggering said phototransistor.

8. An electrical switching device comprising a housing, a focusing element mounted within said housing, an opaque spacer passing through said focusing element, a light emitting device mounted on said spacer, a light detecting device for performing a switching function mounted on the spacer in a back-to-back relation with said light emitting device, means connected to said light emitting device passing to the outside of said focusing element for causing said device to emit radiant energy, manually operable reflecting means arranged for movement with respect to said emitting and detecting devices so that when said reflecting means is moved from an inoperative to an operative position, the radiant energy being emitted from said light emitting device will be directed at said reflecting means so as to be reflected at said detecting means to thereby initiate the switching function.

* * * * *